(12) United States Patent
Iijima

(10) Patent No.: US 6,374,024 B1
(45) Date of Patent: Apr. 16, 2002

(54) IMAGE SENSOR AND METHOD OF MANUFACTURING THE SAME

(75) Inventor: Ryuta Iijima, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/400,973

(22) Filed: Sep. 22, 1999

(30) Foreign Application Priority Data

Oct. 30, 1998 (JP) ............................................. 10-310755

(51) Int. Cl.⁷ .............................. G02B 6/06; G02B 6/04
(52) U.S. Cl. ...................................... 385/116; 385/120
(58) Field of Search ................................ 385/115, 116, 385/119, 120, 146, 33, 34, 35

(56) References Cited

U.S. PATENT DOCUMENTS

| | | | |
|---|---|---|---|
| 4,760,421 A | * | 7/1988 | Margolin ........................ 355/1 |
| 4,856,863 A | * | 8/1989 | Sampsell et al. ............... 385/4 |
| 5,037,173 A | * | 8/1991 | Sampsell et al. ............. 385/17 |
| 5,155,790 A | * | 10/1992 | Hwang ....................... 385/121 |
| 5,877,492 A | * | 3/1999 | Fujieda et al. ........... 250/208.1 |
| 5,930,433 A | * | 7/1999 | Williamson et al. ........ 385/116 |

FOREIGN PATENT DOCUMENTS

JP          A9-37038          2/1997

* cited by examiner

*Primary Examiner*—Ricky Mack

(57) ABSTRACT

An image sensor that is more compact than a contact type image sensor using a rod-lens array and has a depth of field of the same level as a contraction type image sensor using a set of mirrors. The sensor includes an array of a specified pixel-corresponding quantity of micro-lenses arranged for forming an image light reflected from an original document, an array of the specified pixel-corresponding quantity of optical fibers arranged for transmitting an image formed by the micro-lens array as respective optical signals of pixels and an array of light-receiving elements for converting optical signals incident thereon from the optical fiber array into electric signals, wherein the optical fiber array has core-end-faces each having a size smaller than that of an image formed by the micro-lenses and located on the micro-lens-side position from the image forming plane when the original document is placed at a specified base position.

8 Claims, 7 Drawing Sheets

IMAGE SENSOR AND METHOD OF MANUFACTURING THE SAME

BACKGROUND OF THE INVENTION

The present invention relates to an image sensor for use in hard-copy image reading devices such as facsimiles, scanners and so on and relates to a method of manufacturing the same image sensor.

Recently, there has been an increasing demand for further improved and miniaturized one-dimensional image sensors for converting image information into electric signals in conjunction with an increasing demand for image-reading apparatuses such as facsimiles and image scanners. Among the existing one-dimensional image sensors, there are two predominant types, one of which is a contract type optical image sensor using mirror and the other is a contact image sensor using a rod-lens array. A contract type image sensor using a micro-lens array and an optical waveguide array has been last developed.

FIG. 1 is illustrative of a system of a conventional contract type image sensor. Light from an LED array 1 striking a surface of an original 2 is reflected to a mirror 22 wherefrom it is further reflected several times between mirrors 22. After this, the reflected light passes a lens 23 and forms an image on a light-receiving element array 5. Thus, the image information can be obtained.

FIG. 2 is illustrative of a conventional contact type image sensor using a typical rod-lens array 24. Light from an LED array 1 striking a surface of an original 2 is reflected and fall into a rod-lens array 24 through which it passes and forms an image on a light-receiving element array 5. This device can be miniaturized owing to its simple construction.

FIG. 3 is illustrative of a contract type image sensor using a conventional micro-lens array 3 and optical waveguide array 25. Light from an LED array striking a surface of an original 2 is reflected to a micro-lens array 3 including the specified number of equally spaced micro-lenses corresponding to respective pixels of a specified image format. The converged light passes the optical waveguide array 25 and forms an image on a light-receiving sensor array 5. The device can be thus miniaturized. Furthermore, it is possible to precisely induce rays of light from the micro-lens array into the optical waveguide array 25 by matching numerical aperture NA of the micro-lens array 3 with that of the optical waveguide array 25. This is disclosed in Japanese Laid-Open Patent Publication No. 9-37038.

The contract type image sensor of FIG. 1, however, necessarily contracts a whole image information to 1/10 in size through a lens. Therefore, the sensor must have an elongated conjugate length. For example, a distance from an original document of B4 in format size to a light-receiving element may be about 330 mm. An optical path is usually folded by mirrors 22. However, the conjugate length of the device is above 70 mm. This makes it difficult to further reduce the size of the device.

The contact type image sensor using a rod-lens array 24 as shown in FIG. 2 can have a considerably reduced distance between an original document and a light-receiving element by using a short-focusing lens since whole image information is formed in the same scale. The latest model has the document-to-element distance of about 10 mm. However, the device of this type has a very shallow depth of field of, e.g., 0.5 mm at which its MTF can be maintained at a level higher than 40% for the specification of 200 dots per inch. Application of a sensor having a shallow depth of field in a handy scanner or a flat head scanner may arise a problem that an uneven surface portion of a double spread page of a book or pasted slips cannot be read. To avoid this, a rod-lens having a small numeral aperture (NA) and a deep focal depth must be used. However, the use of such a rod-lens may elongate the conjugate length of the device. For example, a rod-lens array 24 having a depth of field of about 3 mm has a conjugate length of about 50 mm resulting in increasing the size of the device. In addition, the rod-lens array having a deep depth of field is expensive.

The compact type sensor may have a depth of field of 6 mm or more on the same conditions.

As described above, both types of sensors involve such a common problem that miniaturization of the device is always accompanied by shallowing a depth of field of the lens array while the use of the lens array having a deep depth of field necessarily increase the size of the device. In other words, these two factors are tradeoffs to each other.

There has been developed an image sensor (FIG. 3) having a micro-lens array and an optical waveguide array, which has a 20 mm distance between an original document (B4 in size) and a light-receiving element. As disclosed in Japanese Laid-Open Patent Publication No. 9-37038, this image sensor is constructed in such a way that the micro-lens array 3 and the optical waveguide array 25 have the same numeric aperture and the image forming size of the former matches the core size of the latter. This feature can considerably reduce the crosstalk from neighboring elements of micro-lens array 3 and neighboring pixels. However, this arrangement may cause another problem that an image being in out-of-focus or as contacted in size due to a floating area of the original document may increase crosstalk and cause a considerable change in quantity of light due to the out-of-focus position of the image. In addition, this device causes an image information from the original to be contracted through the curved optical waveguide array and, therefore, may be necessarily increased in its general size as the number of image pixels increases. The device is more difficult to be miniaturized than the contact type sensor using a rod-lens array. It is also noted that elongation of the optical waveguide array is accompanied by increasing loss of light therein.

SUMMARY OF THE INVENTION

Accordingly, an object of the present invention is to provide an image sensor that includes an array of a specified pixel-corresponding quantity of micro-lenses arranged for forming an image of light reflected from an original document, an array of the specified pixel-corresponding quantity of optical fibers or waveguides arranged for transmitting an image formed by the micro-lens array as respective optical signals of pixels, and an array of light-receiving elements for receiving optical signals from the optical fiber or waveguide array and converting the signals into electric signals, wherein the optical fiber array or optical waveguide array has cores whose end-faces have each a size smaller than a size of an image formed by corresponding micro-lens and are located on the micro-lens-side from the image forming plane when the original document is placed at a given position. The construction of this image sensor is such that an image information of the original is transmitted pixel by pixel through pairs of micro-lens with an optical fiber or waveguide to respective light-receiving elements. This may reduce crosstalk due to floating of the original from the base level and contraction of its image through the micro-lens array if the image is formed in size larger than the core of the optical fiber or waveguide when the original document is placed at a given position. The image formed thus being in out of focus can be read at its center portion by the optic fiber array whose core-end-faces are located on the micro-lens side from the image-forming plane. This means that floating of the original may approach the image-forming plane to the core-end-faces of the optical fiber array, thereby the image becomes improved with a reduced variation of light quantity. As the result of the above-described effects, an image finally obtained through the light-receiving element array can have a deep depth of field.

Another object of the present invention is to provide an image sensor that includes an array of a specified pixel-corresponding quantity of micro-lenses arranged for forming an image of light reflected from an original document, an array of the specified pixel-corresponding quantity of optical fibers arranged for transmitting an image formed by the micro-lens array as respective optical signals and an array of light-receiving elements for receiving the optical signals from the optical fiber array and converting them into electric signals, wherein the optical fiber array has the optical fibers arranged parallel to each other therein. This image sensor attains a very compact and effective construction allowing a light signal from the micro-lens array to be transferred to the light-receiving element array through a shortest path with a minimum loss of light. Furthermore, the sensor is inexpensive since its optical fiber array is suitable for mass production at a low cost by the same method as manufacturing the rod-lens array and is easy to be coupled with the light-receiving element array owing to a wide pitch between the arrays.

Another object of the present invention is to provide an image sensor that uses an optical fiber array formed by arranging optical fibers each composed of a core and a clad in an array, bonding them to a jig with adhesive containing nontransparent material having a refractive index higher than that of the clad and further providing light-shield film covering incident (input-side) end-faces of the optical fibers excluding core end-faces. This image sensor can shut off light falling on the end-faces of the clads, which may become stray light if it was allowed to enter therein. A part of incident light, which has entered each core at a larger numeric aperture NA, may be refracted into the clad and then absorbed by an adhesive layer having a higher refractive index. Furthermore, this array can be formed from conventional optical fibers each composed of a core and a clad.

Another object of the present invention is to provide an image sensor that uses an optical fiber array formed by arranging optical fibers each composed of a core and a clad having a refractive index being, at its inside, lower than that of the core and gradually increasing toward its outside surface and then adhering the optical fibers to a jig with adhesive containing nontransparent material having a refractive index higher than that of that of the outside surface of the clad. This image sensor can shut off light falling on the clad, which may become stray light if it enters therein. Furthermore, a part of incident light, which enters the core at a larger numeric aperture NA is refracted into clad, can be lead toward the outside of the clad and absorbed by an adhesive layer containing a substance having a higher refractive index. This optical fiber array has no need for provision of further shielding for shutting of f light falling on the clads such as light shielding film.

Another object of the present invention is to provide an image sensor using an optical fiber array in which optical fibers each having a three-layer structure composed of a core, a clad and an absorbing layer, with a refractive index of the clad sandwiched between the core and the absorbing layer, are lower than those of the core and the absorbing layer, are arranged in an array and fixed to a jig with adhesive containing nontransparent material. In this sensor, stray light may enter into the clad, hit the absorbing layer and is completely absorbed and attenuated therein since the absorbing layer has a higher refractive index than that of the clad. This optical fiber array dose not require any further protection against stray light such as light shielding film.

Another object of the present invention is to provide an image sensor that uses a jig with optical fibers adhered thereto and having a thermal expansion coefficient substantially equal to that of the light-receiving elements to be coupled therewith. This image sensor can be free from occurrence of misalignment (pitch error) between the optical fiber array and the light-receiving element array owing to the same level of thermal expansion.

Another object of the present invention is to provide a method of manufacturing an image sensor, which comprises steps of: putting a transparent substrate on an end-face of an optical fiber array or an optical waveguide array, applying an ultraviolet-curing resin-coat on the substrate, forming thereon cylindrical islands each having a diameter corresponding to a region of divergent angle of the optical fibers or optical waveguides by ultraviolet radiation from the reverse-side end-face and forming spherical lens surfaces of the respective islands by thermal reflowing and simultaneously adjusting the transparent substrate thickness to a value at which each micro-lens being shaped to the effective region of diverging radiation of each optical fiber or each optical waveguide can have a diameter smaller than that of a pixel. The manufacturing method can easily produce a micro-lens array that has element-to-element pitches corresponding to those of the optical fibers or optical waveguides. This image sensor has no need of optical alignment of micro-lens array with optical fiber or waveguide array.

Another object of the present invention is to provide a method of manufacturing an image sensor, which comprises steps of: putting a transparent substrate on an end-face of an optical fiber array or an optical waveguide array, applying a photosensitive resin layer on the substrate, forming thereon swellings each having a diameter corresponding to a region of divergent angle of the optical fibers or the optical waveguides by ultraviolet radiation from the reverse-side end-face and forming semi-spherical lens surfaces of the respective islands by the effect of allowing therein unreacted monomers. At the same time, the thickness of the transparent substrate is adjusted so that each micro-lens to be shaped to the effective region of diverging light of each optical fiber or each optical waveguide may have a diameter smaller than that of a pixel. The manufacturing method can easily produce a micro-lens array whose element-to-element pitch corresponds to that of the optical fiber array or the optical waveguide array. This method also assures realizing the above-mentioned effect.

PREFERRED EMBODIMENTS OF THE PRESENT INVENTION

Referring to the accompanying drawings, preferred embodiments of the present invention will be described below in detail. However, it should be noted that the present prevention is not restricted to those preferred embodiments, which are conceptually illustrated with the quantities of micro-lenses, optical fibers and light-receiving elements necessary for resolving an image (i.e., pixels contained in an image).

Figure 4:
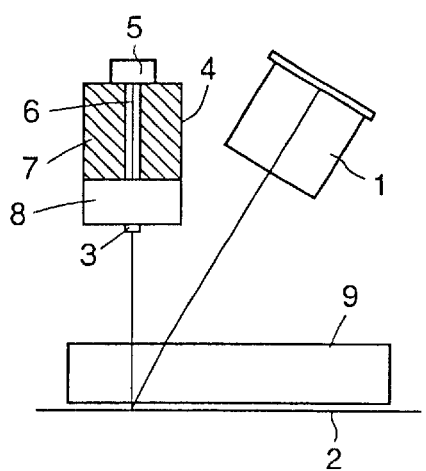
FIG. 4 is illustrative of an image sensor according to an aspect of the present invention, which is seen from the main scanning direction.
Figure 5:
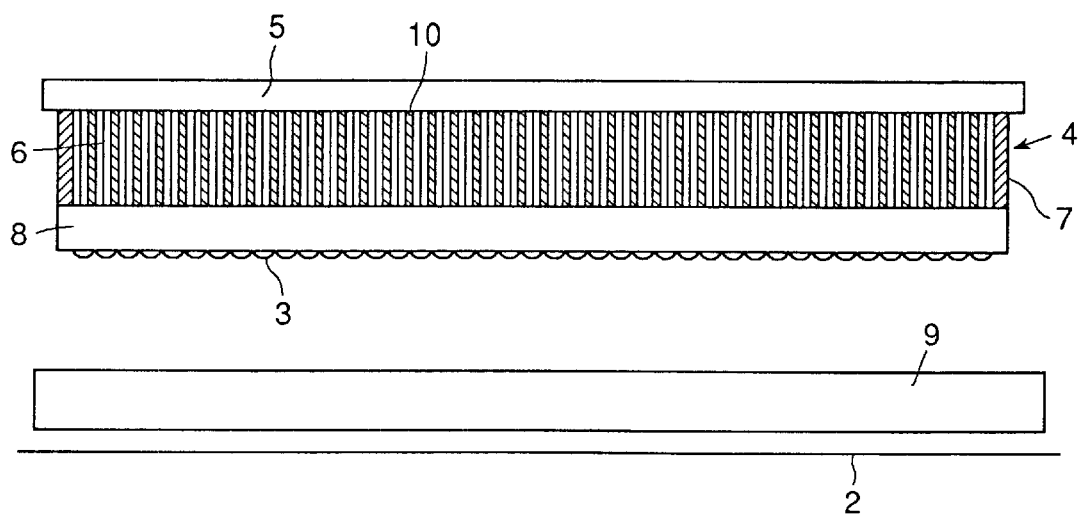
FIG. 5 is illustrative of an image sensor according to an aspect of the present invention, which is seen from the sub-scanning direction.

FIGS. 4 and 5 illustrate an image sensor of the present invention as seen from the main scanning direction and the sub-scanning direction respectively. This image sensor has an optical system in which light from an LED array 1 is reflected from an original document surface 2 and then formed an image of light by a micro-lens array 3 that then transmits the image as a light signal to an optical fiber array 4 that in turn transmits the light signal to a light-receiving element array 5.

Figure 6:
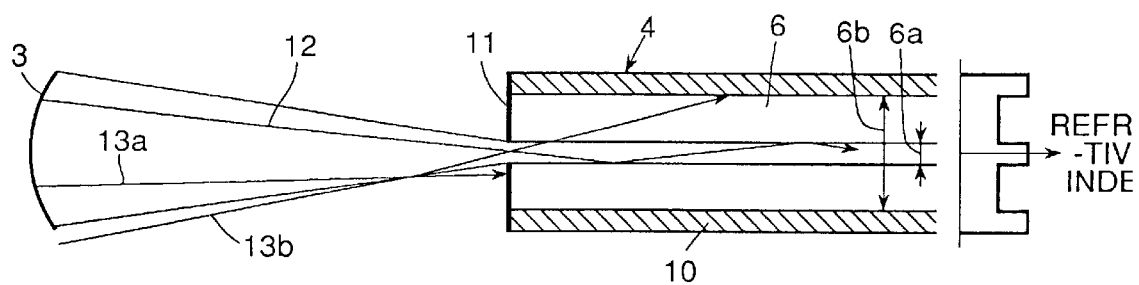
FIG. 6 is a sectional view of an optical fiber array according to an aspect of the present invention.

FIG. 6 illustrates an optical fiber array 4 in section viewed from the sub-scanning direction, which array is used in an image sensor according to an aspect of the present invention. In FIG. 6, there is also shown a graph indicating a distribution of refractive index of the optical fiber in the radial direction thereof. The optical fiber 6 is of the conventional two-layer-type composed of a core 6a and a clad 6b, which have radii of 4 $\mu$m (core) and 56 $\mu$m (clad) respectively. The numerical aperture NA of the optical fiber is 0.181. 2048 pieces of optical fibers 6 are linearly disposed in a plane in parallel to each other at intervals (pitches) of 125 $\mu$m and fixed to a jig (holder) 7 with adhesive 10 containing nontransparent material, then is cut to 1 mm in length to form an optical fiber array 4. The content of nontransparent material in the adhesive 10 has been regulated so that the adhesive layer 10 has a refractive index higher than that of the clad of the optical fiber.

The jig 7 is made of material having the same level of thermal expansion coefficient as the light-receiving element array 5 has. This prevents the occurrence of misalignment (pixels) between the optical fiber array and the light-receiving element array, which may be resulted from the difference of thermal expansion values of their materials. In the optical fiber array 4, the incident-side ends of the optical fibers excluding the end-faces of cores 6a are provided with light shielding film 11 to shut off light rays 13a falling out of the core end-faces and to allow light to enter only through the end-faces of the cores in the array. Among the incident rays having entered each optical fiber core, light 13b having a larger numerical aperture is refracted into clad 6b wherein they become stray light that has an angle to the optical axis and therefore hits the adhesive 10 having a higher refractive index and absorbed therein. This optical fiber array 4 may use conventional optical fibers each composed of only a fiber core and a clad.

A light shielding film was formed on the incident-side end-faces of each optical fiber by using the following method:

The optical fibers 6 fixed to the jig 7 are cut off their incident-side ends and clad ends 6b are etched by dipping it into a buffered hydrofluoric acid solution. Then, the entire end-faces of the optical fibers are coated with ultraviolet-curing resin containing nontransparent (shielding) material that is then hardened by ultraviolet radiation. The coat of each optical fiber is ground off until the end-surface of each core is exposed.

Alternatively, the following method can be also applied.

The optical fibers 6 fixed to the jig 7 are cut off their incident-side ends and coated with photoresist. Then, ultraviolet radiation is introduced through the reverse-side end-face of the optical fiber array 4 being bent in the direction of the fibers. The ultraviolet radiation selectively forms resist patterns on the incident-side end-faces of the cores since ultraviolet rays having entered the clads are absorbed by the resin adhesive layers 10. After this, a thin metal coat is applied onto the incident-side end-face of the optical fiber array and then the photoresist patterns are removed from there to expose only the end-faces of the cores in the array.

Referring now to FIGS. 7A to 7D, a method of forming a micro-lens array 3 on an optical fiber array 4 will be described below.

Figure 7A:
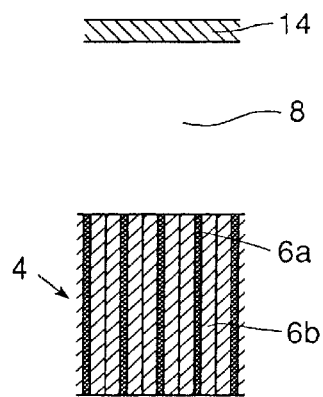
FIGS. 7A to 7D are views for explaining a method of manufacturing micro-lenses used in an embodiment of the present invention.

(A) A transparent substrate 8 of about 500 $\mu$m in thickness is bonded to the end-face of the optical fiber array 4, which end-face is facing to the original document. A uniform coat of photoresist is then applied on a whole surface of the substrate 8 as shown in FIG. 7A.

Figure 7B:
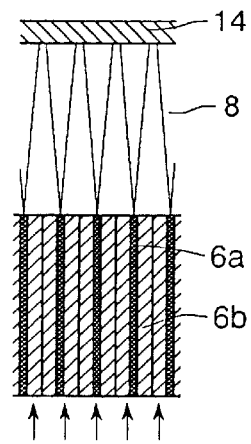

(B) Ultraviolet radiation is applied to the substrate from the reverse (output) end-face of the optical fiber array through which the ultraviolet rays are restricted within a region of divergent angle defined by the numerical aperture (NA) of the array and hit only the resist portion 14 within the corresponding areas as shown in FIG. 7B.

Figure 7C:
Figure 7C:
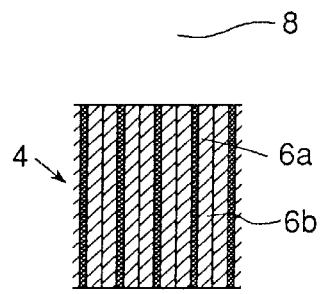

(C) Cylindrical islands 15 are formed by developing as shown in FIG. 7C.

Figure 7D:
Figure 7D:
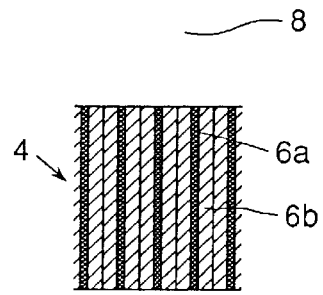

(D) The islands are reflowed by heat to form spherical islands 16 that are then entirely exposed to light beams to obtain decolored resist as shown in FIG. 7D. Thus, a micro-lens array is formed on the substrate of the optical fiber array. A curvature radius of each micro-lens is set to 160 $\mu$m.

There is an alternative method for forming a micro-lens array. A transparent substrate is bonded to the end-face of an optical fiber array 4 and coated with a photosensitive resin layer. The resin layer formed on the substrate is exposed to ultraviolet radiation induced from the reverse end-face of the optical fiber array. This causes unreacted monomers to move up into each resin area within a circle whose diameter corresponds to a region of divergent angle of each optical fiber in the array, resulting in forming a spherical surface of the area. The micro-lens array is thus formed. Alternatively, it is allowed that an array of micro-lenses is separately formed for example by an injection forming method and then attached to an optical fiber array.

A CCD (charge-coupled-device) type linear sensor is used as the light-receiving element array 5. Light-receiving windows each having a size of 110×110 μm in the main and sub scanning directions respectively are arranged at intervals of 125 μm in an array. This light-receiving element array can be easily coupled with the optical fiber array at a coupling accuracy of 50 μm.

A distance from the micro-lens surfaces to the light-outgoing end-face of the optical fiber array is 1.5 mm. A distance from the micro-lens array 3 to a protective transparent film 9 is 1.5 mm. The thickness of the protective transparent film 9 is 0.75 mm to obtain a distance of 2.25 mm between the original document and the micro-lens array. A substrate holding thereon the light-receiving elements and other circuit elements is 1 mm, so a total height of the image sensor is not more than 5 mm. This size of the image sensor is smaller than that of any conventional contact type image sensor using a rod-lens array and considerably smaller than that of any conventional contraction type image sensor using a set of mirrors.

Figure 8A:
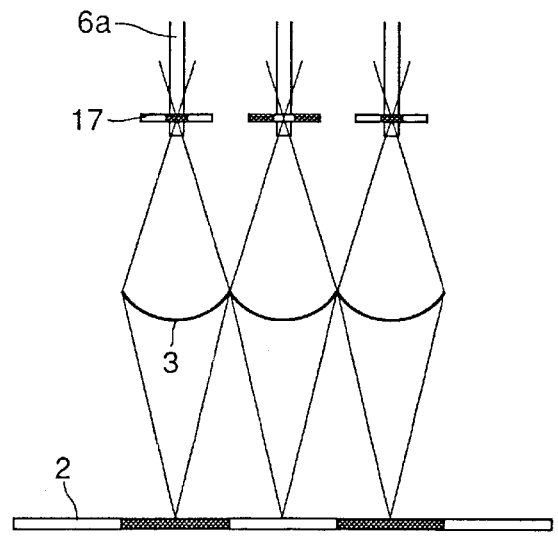
FIGS. 8A and 8B show a change in quantity of image light detected by an image sensor of the present invention when an original document being floated from a preset level.
Figure 8B:
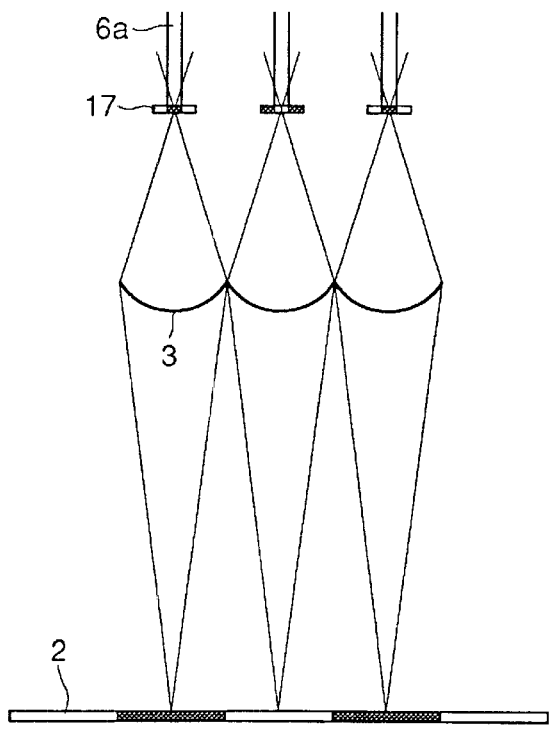

FIGS. 8A and 8B illustrate how to read an original by the image sensor in case (A) when the original placed in a given place as shown in FIG. 8A and in case (B) when the surface of the original is floated from the given position as shown in FIG. 8B. In the case (A) when the surface of the original is apart from the micro-lens by 2.5 mm, an image-forming plane 17 lies at a plane deeper by a specified value from the end-face of each optical fiber. A distance from a principal point of the micro-lens array 3 to the end-face of the optical fiber is within 510–520 μm including a total thickness of the transparent substrate 8 and the adhesive layer. This figure is close to the image forming plane 17 in a PMMA (polymethyl-methacrylate) layer having a refractive index of 1.492 when a distance between the original and the micro-lens array is set to 7.5 mm. Namely, an image is formed just on the end-face of the optical fiber array in the case B when the original 2 is floated by 5 mm from the base level. In this instance, a single pixel image has a size of 6 μm which can be effectively recognized since it is read by a 8 μm diameter core of each optical fiber. Although an image 17 formed at the preset document-to-micro-lens distance of 2.5 mm is out of focus and has a larger size of 25 μm, the optical fiber core can read a center portion of the image where only a small out-of-focus effect is estimated. This can also reduce a change in quantity of light incident to the optical fiber.

Figure 9:
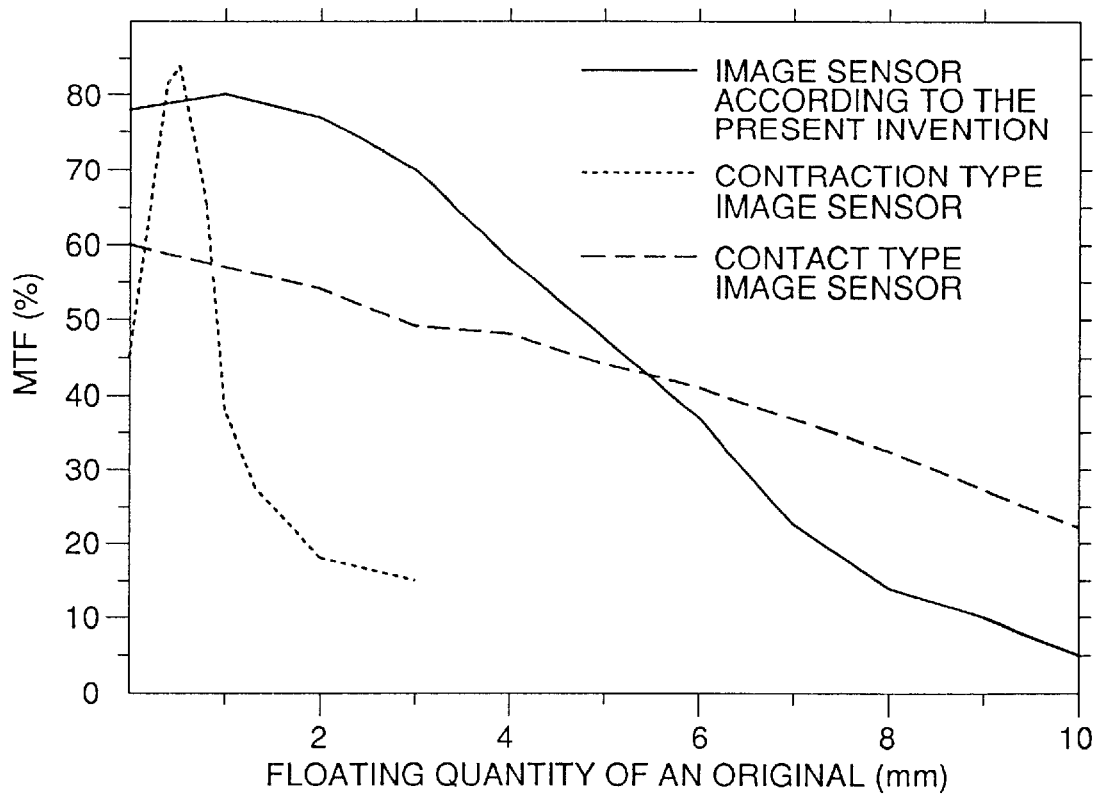
FIG. 9 is a graph showing the dependency of MTF capacity upon a floating quantity of an original, which were obtained by reading an original page of 4 line pair/mm by an image sensor of the present invention, a conventional contraction type image sensor and a conventional contact type image sensor respectively.

FIG. 9 is a graph showing the dependency of MTF upon floating quantity of an original apart from the base surface (an outside surface of a transparent protective layer) when the image sensor read an original page of 4 line·pair/mm. In FIG. 9, there are also shown, for comparison purpose, the MTF characteristics of a typical contraction type image sensor and a typical rod-lens contact type image sensor when having read the same document. The image sensor of the present image has an MTF value of 70% at the preset distance value, which is remarkably higher than that of the contraction type image sensor. The image sensor can also maintain its MTF value of not less than 40% with a document floating of 5 mm. This can match the performance of the contact type image sensor.

Figure 1:
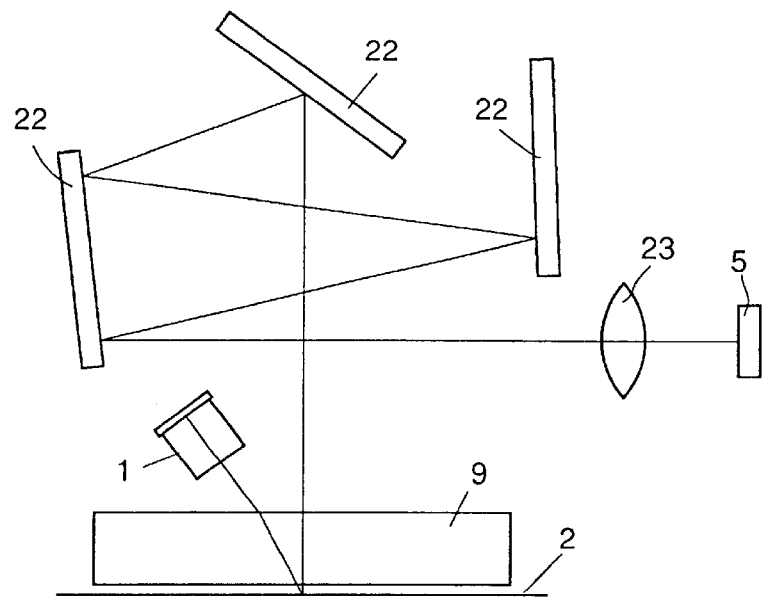
FIG. 1 is illustrative of a conventional contraction type image sensor using mirror optics.
Figure 2:
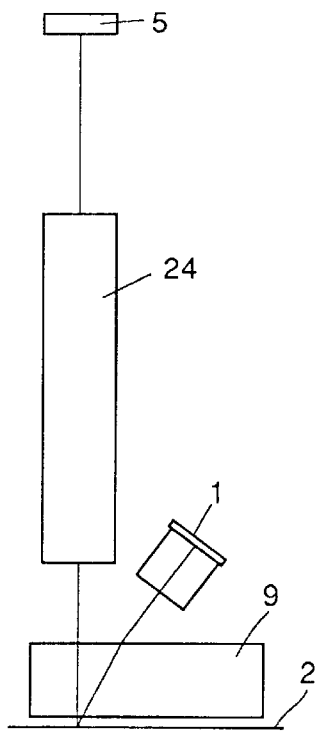
FIG. 2 is illustrative of a conventional contact type image sensor using a rod-lens array.
Figure 3:
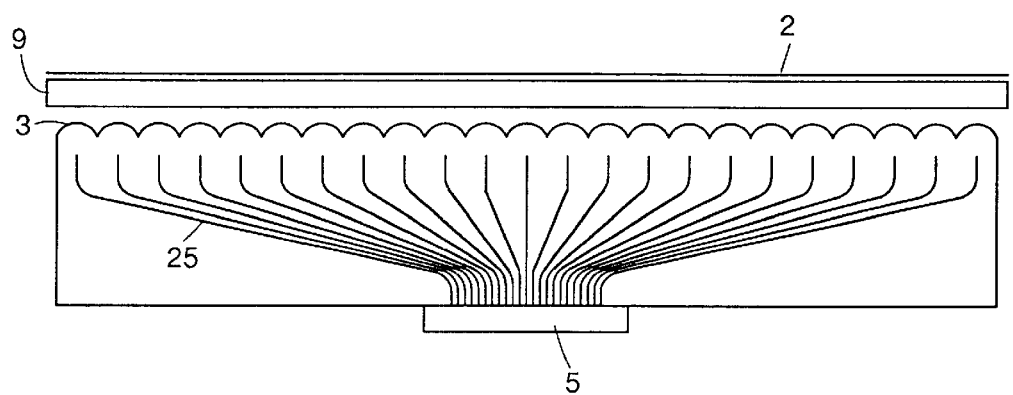
FIG. 3 is illustrative of a conventional contraction type image sensor using an optical waveguide array.

The preset value of the micro-lens-to-fiber distance and the preset size of the core end-face (FIGS. 8A and 8B) can also be applied to the conventional contractive optical-waveguide type image sensor of FIG. 3, which may thereby possess an increased depth of field.

The image sensor of the present invention can realize the same effects as the above by using either of the two following alternate embodiments of optical fiber arrays.

Figure 10:
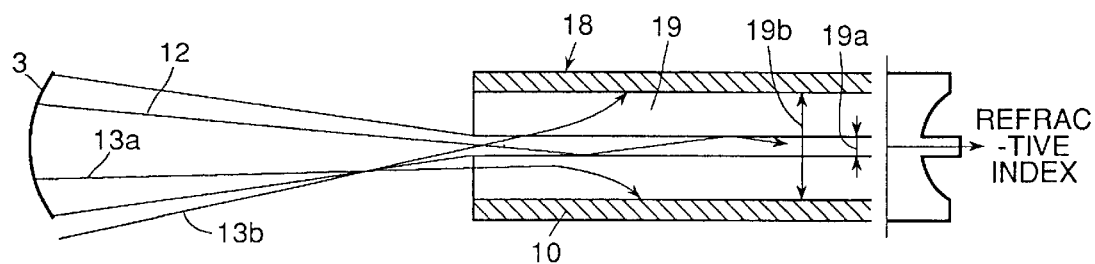
FIG. 10 is a sectional view of an optical fiber array according to an aspect of the present invention.

FIG. 10 illustrates, in section viewed in the sub-scanning direction, an optical fiber array 18 for use in the image sensor according to the present invention, including a graph showing a distribution of refractive indexes in radial directions of the optical fiber. An optical fiber 19 used therein has a typical two-layered construction consisting of a core 19a and a clad 19b, which have radii of 4 and 56 μm respectively. As shown in the graph of FIG. 10, the clad 19a possesses gradually increasing refractive indexes in such a way that the refraction at the most inside thereof is lower than that of the core 19a and gradually increases toward the outside. A numerical aperture NA is 0.181. An optical fiber array 18 is formed by arranging 2048 pieces of optical fibers 19 in parallel with each other at intervals of 125 μm in a plane, bonding them onto a jig (holder plate) 7 with resin adhesive 10 containing nontransparent material and cutting the fibers to 1 mm in length. The resin adhesive 10 is mixed with nontransparent material to obtain a refractive index higher than that of the outside surface of the clad 19b. The jig 7 is made of material having a thermal expansion coefficient equal to that of the light-receiving element array 5. In the optical fiber array 18, allows incident light to enter the optical fibers through end-faces of clads 19b and cores 19a of the fibers. The light 13a having entered directly each clad and the light 13b having entered first each core end-face of the optical fiber with a larger numerical aperture NA are refracted into the clad travel therein and strike the nontransparent adhesive layer having a further higher refractive index and completely absorbed therein. This method eliminates the need for providing the end faces of clads with light shields for shutting off stray light.

Figure 11:
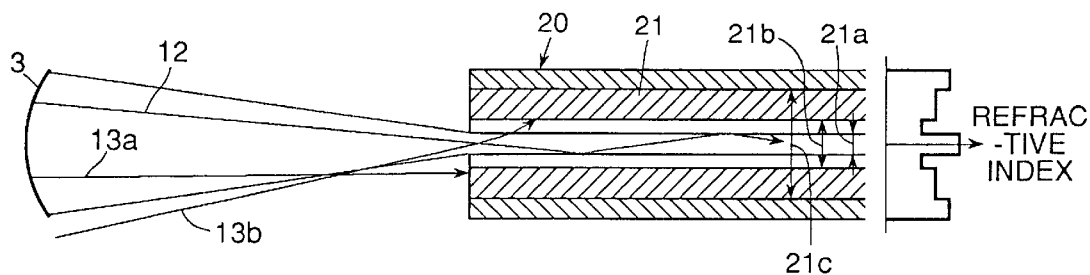
FIG. 11 is a sectional view of an optical fiber array according to another aspect of the present invention.

FIG. 11 illustrates, in section viewed in the main scanning direction, an optical fiber array 20 for use in the image sensor according to the present invention, including a graph showing a distribution of refractive indexes in radial directions of the optical fiber. An optical fiber 21 used therein has a three-layered construction consisting of a core 21a, clad 21b and absorbing layer, which have radii of 4, 2 and 56 μm respectively. The refractive indexes of the three layers are in such a relationship that the index of the core 21a> the index of the clad 21b< the index of the absorbing layer 21c. The numerical aperture NA of each optical fiber is 0.181.

The optical fiber array 20 is formed by arranging 2048 pieces of optical fibers 21 in parallel with each other at intervals of 125 μm in a plane, bonding them onto a jig (holder plate) 7 with resin adhesive 10 containing nontransparent material and cutting the fibers to 1 mm in length. All components excepting the fiber core 21a and clad 21b are made of nontransparent material not allowing passing of unnecessary light. The jig 7 is made of material having a thermal expansion coefficient equal to that of the light-receiving element array 5.

The outside absorbing layer 21c having the higher refractive index is provided around the thin clad 21b and it can absorb all the stray light entering therein through the clad 21b.

The image sensors manufactured with these optical fiber arrays 18 and 20 respectively were subjected to the same tests for reading the same original document and proved to have the reading ability matching that of the image sensor of the present invention, which performance is shown in FIGS. 8A and 8B.

All the above-described embodiments of the present invention use optical fiber arrays. Alternatively, an image sensor may use an optical waveguide array in place of an optical fiber array. The optical waveguide array can be manufactured for example by embedding a number of optical waveguides made of core material in respective grooves made in a substrate. The optical waveguide array can thus be assembled with ease at high accuracy as compared with the optical fiber array that requires prearranging a number of fibers in an array. However, the optical waveguide array cannot be provided with protection for shutting off stray light, so it may have somewhat increased noise level as compared with the optical fiber array.

As is apparent from the foregoing, the image sensors according to the present invention can offer the following advantageous effects:

(1) The image sensor according to the present invention realizes an optical system in which an image information of the original is transmitted pixel by pixel through pairs of a micro-lens and an optical fiber or an optical waveguide to respective light-receiving elements. This may reduce crosstalk between fibers due to floating of the original document surface from the base level position and contraction of its image through the micro-lens array if the image formed in size larger than the core of the optical fiber or waveguide when the original document is placed at a given position. The image formed out of focus can be read at its center portion by the optical fiber array whose core end-face is located on the micro-lens side from the image-forming plane. This means that floating of the original may approach the image-forming plane to the core-end-faces of the optical fiber array, thereby the image becomes improved with a reduced variation of light quantity. As the result of the above-described effects, an image finally obtained through the light-receiving element array can have an increased depth of field.

(2) The image sensor according to another aspect of the present invention realizes a very compact and effective optical system allowing a light signal from the micro-lens array to be transferred to the light-receiving element array through a shortest path with a minimum loss of light. Furthermore, the sensor is inexpensive because its optical fiber array is suitable for mass production at a low cost by the same method as the rod-lens array and is easy to be coupled with the light-receiving element array owing to a wide pitch between the arrays.

(3) The image sensor according to another aspect of the present invention can shut off light falling on each clad, which may become stray light if it enters therein. A part of incident light may enter the core at a larger numeric aperture NA and is refracted into clad and then absorbed by an adhesive layer having a higher refractive index. Furthermore, this optical fiber array can be formed from conventional optical fibers each composed of a core and a clad.

The image sensor according to another aspect of the present invention can shut off light from entering into the clad, which may become stray light if it enters therein. Furthermore, a part of incident light enters each core end-face of the optical fiber with a larger numeric aperture NA and is refracted into the clad and then enters an adhesive layer containing a material having a higher refractive index, wherein the stray light is absorbed. This optical fiber array has no need for further protection of shutting off stray light.

In the image sensor according to another aspect of the present invention, stray light having entered the clad is refracted into the absorbing layer and completely absorbed and attenuated therein since the absorbing layer has a higher refractive index than that of the clad. This optical fiber array doses not require any further protection against stray light.

The image sensor according to the present invention can be free from occurrence of misalignment between the optical fiber array and the light-receiving element array owing to the same level of their thermal expansion.

The method of manufacturing an image sensor according to the present invention can easily produce a micro-lens array which has an element-to-element pitch corresponding to that of the optic fiber array or optical waveguide array. This image sensor does not need optical alignment of micro-lens array with optical fiber or waveguide array.

What is claimed is:

1. An image sensor comprising,
    an array of a specified quantity of pixel-corresponding micro-lenses arranged for forming an image of light reflected from an original document,
    an array of the specified quantity of pixel-corresponding optical fibers or waveguides arranged for transmitting the image formed by the micro-lens array as respective optical signals, and
    an array of light-receiving elements for receiving optical signals from the optical fiber array or the optical waveguide array and converting the optical signals into electric signals, wherein the optical fiber or waveguide array has core-end-faces each having a size smaller than that of an image formed by the micro-lenses and being located on the micro-lens-side from the image forming plane when the original document is placed at a given position.

2. An image sensor comprising an array of a specified quantity of pixel-corresponding micro-lenses arranged for forming an image of light reflected form an original document,
    an array of the specified quantity of pixel-corresponding optical fibers arranged for transmitting an image formed by the micro-lens array as respective optical signals and
    an array of light-receiving elements for receiving optical signals from the optical fiber array and converting the optical signals into electric signals, wherein the optical fiber array has the optical fibers arranged parallel to each other therein.

3. An image sensor as defined in claim 2, wherein the optical fibers each composed of a core and clad are arranged in an array and fixed to a jig with adhesive containing nontransparent material having a refractive index higher than that of the clad and are further provided with a light shielding film covering all input-side end-faces excluding core-end-faces.

4. An image sensor as defined in claim 2, wherein the optical fibers each composed of a core and clad whose refractive index is, at its inside, lower than that of the core and gradually increases toward its outside surface are arranged in an array and then fixed to a jig with adhesive containing nontransparent material having a refractive index higher than that of the outside surface of the clad.

5. An image sensor as defined in claim 2, wherein the optical fibers each having a three-layer structure composed of a core, a clad and an absorbing layer, with a refractive index of the clad lower than that of the core and lower than that of the absorbing layer, are arranged in an array and fixed to a jig with adhesive containing nontransparent material.

6. An image sensor as defined in claim 3, wherein the jig with optical fibers fixed thereto has a thermal expansion coefficient substantially equal to that of the light-receiving elements to be coupled therewith.

7. A method of manufacturing an image sensor defined in claim 1 or 2, comprising steps of: putting a transparent substrate on an end-face of the optical fiber array or the optical waveguide array, applying an ultraviolet-curing resin-layer on the substrate, forming thereon cylindrical islands each having a diameter corresponding to a region of divergent angle of the optical fibers or the optical waveguides by ultraviolet radiation from a reverse-side end-faces and forming spherical lens surfaces of the islands by thermal reflowing and simultaneously adjusting a thickness of the transparent substrate to a value at which each micro-lens being shaped to the effective region of diverging light of each optical fiber or each optical waveguide can have a diameter smaller than that of a pixel.

8. A method of manufacturing an image sensor defined in claim 1 or 2, comprising steps of: putting a transparent substrate on an end-face of the optical fiber array or the optical waveguide array, applying a photosensitive resin-layer on the substrate, forming thereon swellings each having a diameter corresponding to a region of divergent angle of the optical fibers or the optical waveguides by ultraviolet radiation from the reverse-side end-faces and forming spherical lens surfaces of the swellings by allowing unreacted monomer to move therein and simultaneously adjusting a thickness of the transparent substrate to a value at which each micro-lens being shaped to the effective region of diverging light of each optical fiber or each optical waveguide can have a diameter smaller than that of a pixel.

* * * * *